United States Patent
Chaney et al.

(10) Patent No.: US 10,418,223 B1
(45) Date of Patent: Sep. 17, 2019

(54) FOIL SHEET ASSEMBLIES FOR ION IMPLANTATION

(71) Applicant: Varian Semiconductor Equipment Associates, Inc., Gloucester, MA (US)

(72) Inventors: Craig R. Chaney, Gloucester, MA (US); Adam M. McLaughlin, Merrimac, MA (US); James A. Sargent, Gloucester, MA (US); Joshua M. Abeshaus, Salem, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/941,163

(22) Filed: Mar. 30, 2018

(51) Int. Cl.
*H01J 37/09* (2006.01)
*C23C 14/48* (2006.01)
(Continued)

(52) U.S. Cl.
CPC ............ *H01J 37/08* (2013.01); *C23C 14/48* (2013.01); *H01J 27/026* (2013.01); *H01J 27/205* (2013.01); *H01J 37/3171* (2013.01)

(58) Field of Classification Search
CPC .. H01J 27/02; H01J 17/54; H01J 2237/31705; H01J 49/04; H01L 21/67346;
(Continued)

(56) References Cited

U.S. PATENT DOCUMENTS 2,806,958 A * 9/1957 Zunick .................. G21K 1/025
216/63
2,980,410 A * 4/1961 Edvar .................. B29B 13/023
34/87
(Continued)

FOREIGN PATENT DOCUMENTS

GB          1240069 A      7/1971
KR   10-2007-0007621 A    1/2007
KR       10-1630233 B1    6/2016

OTHER PUBLICATIONS

Inokawa et al., "Characteristics of Al Films Formed by Ionized Cluster Beam Deposition", Ion Beam Engineering Experimental Laboratory, Kyoto University, Kyoto, Japan, 1982.
(Continued)

*Primary Examiner* — David A Vanore
(74) *Attorney, Agent, or Firm* — Nields, Lemack & Frame, LLC

(57) ABSTRACT

A foil liner comprising a plurality of foil layers is disclosed. The foil layers may each be an electrically conductive material that are stacked on top of each other. The spacing between adjacent foil layers may create a thermal gradient such that the temperature of the plasma is hotter than the temperature of the ion source chamber. In other embodiments, the foil layers may be assembly to sink the heat from the plasma so that the plasma is cooler than the temperature of the ion source chamber. In some embodiments, gaps or protrusions are disposed on one or more of the foil layers to affect the thermal gradient. In certain embodiments, one or more of the foil layers may be constructed of an insulating material to further affect the thermal gradient. The foil liner may be easily assembled, installed and replaced from within the ion source chamber.

19 Claims, 6 Drawing Sheets

(51) Int. Cl.
*H01J 37/08* (2006.01)
*H01J 27/02* (2006.01)
*H01J 37/317* (2006.01)
*H01J 27/20* (2006.01)

(58) Field of Classification Search
CPC ...... G01N 30/6095; G21K 1/025; H05H 1/54; H05H 6/00; Y10T 428/12438; Y10T 428/12986
USPC ................ 250/423 R, 288, 425; 315/111.21; 313/231.31, 360.1; 392/416; 257/675
See application file for complete search history.

(56) References Cited

U.S. PATENT DOCUMENTS

| | | | | |
|---|---|---|---|---|
| 2,992,345 | A * | 7/1961 | Hansen | H05H 1/54 310/11 |
| 3,712,801 | A * | 1/1973 | Schlehr | C03B 18/16 264/30 |
| 3,843,889 | A * | 10/1974 | Layton | H01J 27/02 250/423 R |
| 4,218,633 | A * | 8/1980 | Mirtich, Jr. | H01J 1/28 313/362.1 |
| 4,293,794 | A * | 10/1981 | Kapetanakos | H01J 27/02 313/230 |
| 4,481,406 | A * | 11/1984 | Muka | C30B 1/02 219/390 |
| 4,800,281 | A * | 1/1989 | Williamson | H01J 27/04 250/423 R |
| 4,879,518 | A * | 11/1989 | Broadhurst | H05H 5/04 315/506 |
| 4,907,245 | A | 3/1990 | Manack | |
| 5,055,169 | A * | 10/1991 | Hock, Jr. | C23C 14/0021 204/298.05 |
| 5,075,594 | A * | 12/1991 | Schumacher | H01J 17/063 250/423 R |
| 5,253,324 | A * | 10/1993 | Wortman | C30B 31/12 118/724 |
| 5,834,787 | A * | 11/1998 | Bunker | H01J 37/244 250/492.21 |
| 5,977,552 | A * | 11/1999 | Foad | H01J 27/04 250/423 R |
| 6,663,826 | B1 * | 12/2003 | Blue | B22F 3/10 264/669 |
| 7,126,808 | B2 * | 10/2006 | Koo | H01L 21/67069 361/234 |
| 7,622,803 | B2 * | 11/2009 | Parker | H01L 21/67103 257/675 |
| 10,109,383 | B1 * | 10/2018 | Parnaste | G21G 1/0005 |
| 2004/0166308 | A1 * | 8/2004 | Raksha | C09D 7/62 428/329 |
| 2004/0217279 | A1 * | 11/2004 | Hobbs | G01N 30/6043 250/288 |
| 2007/0222358 | A1 | 9/2007 | Shonka et al. | |
| 2014/0062286 | A1 | 3/2014 | Sato | |
| 2017/0133193 | A1 | 5/2017 | Colvin et al. | |
| 2017/0221669 | A1 | 8/2017 | Chaney et al. | |

OTHER PUBLICATIONS

International Search Report and Written Opinion dated Jun. 5, 2019 in corresponding PCT application No. PCT/US2019/018883.

* cited by examiner

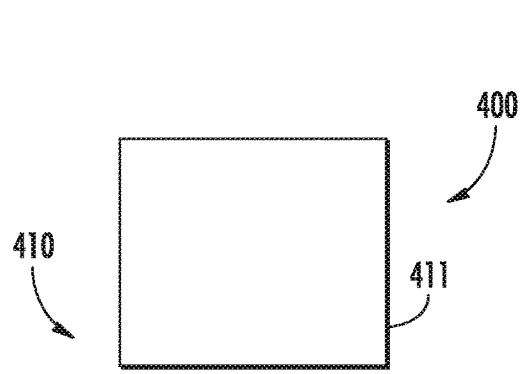
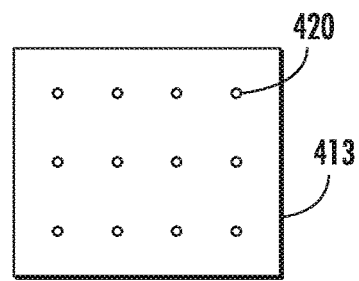
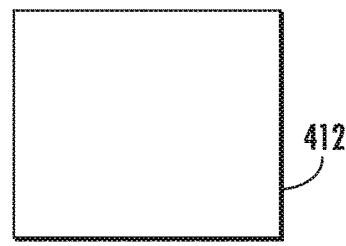
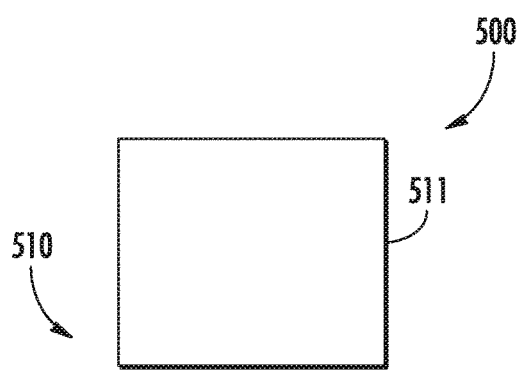
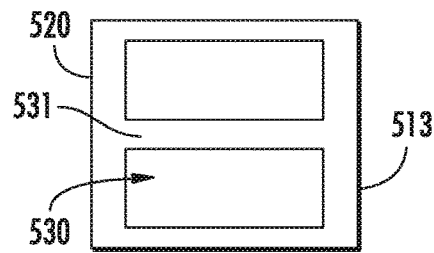
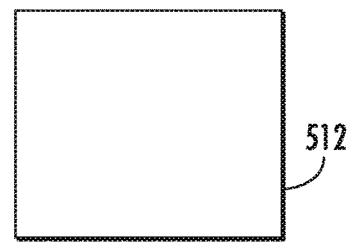
FIG. 4
FIG. 5

FOIL SHEET ASSEMBLIES FOR ION IMPLANTATION

FIELD

Embodiments of the present disclosure relate to foil sheet assemblies for use as liners in an indirectly heated cathode (IHC) ion source.

BACKGROUND

Indirectly heated cathode (IHC) ion sources operate by supplying a current to a filament disposed behind a cathode. The filament emits thermionic electrons, which are accelerated toward and heat the cathode, in turn causing the cathode to emit electrons into the ion source chamber. The cathode is disposed at one end of the ion source chamber. A repeller is typically disposed on the end of the ion source chamber opposite the cathode. The repeller may be biased so as to repel the electrons, directing them back toward the center of the ion source chamber. In some embodiments, a magnetic field is used to further confine the electrons within the ion source chamber. The electrons cause a plasma to be created. Ions are then extracted from the ion source chamber through an extraction aperture.

The ion source chamber is typically made of an electrically conductive material, which has good electrical conductivity and a high melting point. The ion source chamber may be maintained at a certain electrical potential. Additionally, the cathode and the repeller are disposed within the ion source chamber, and are typically maintained at electrical potentials that are different from the ion source chamber.

Ion source chambers are often lined to extend the life of the ion source. For example, tungsten liners are often installed in ion source chambers. These tungsten liners are subjected to ion bombardment and extreme temperatures. As these tungsten liners decay, they may be replaced without having to replace the entirety of the ion source chamber. Tungsten or other high temperature refractory metals are often selected due to its electrical conductance.

Tungsten liners are also thermally conductive, so the heat of the plasma is typically transferred to the ion source chamber. However, in certain embodiments, it may be advantageous to maintain a temperature difference between the plasma and the ion source chamber. Specifically, ion source chamber temperature is a critical parameter particularly for species such as carbon and boron trifluoride, where deposition of unwanted materials builds up on surfaces affecting uniformity, lifetime and cost.

Therefore, it would be beneficial if there were a liner which allows a temperature gradient to be introduced between the plasma and the ion source chamber. Further, it would be advantageous if these liners were low cost and easily replaced.

SUMMARY

A foil liner comprising a plurality of foil layers is disclosed. The foil layers may each be an electrically conductive material that are stacked on top of each other. The spacing between adjacent foil layers may create a thermal gradient such that the temperature of the plasma is hotter than the temperature of the ion source chamber. In other embodiments, the foil layers may be assembled to sink the heat from the plasma so that the plasma is cooler than the temperature of the ion source chamber. In some embodiments, gaps or protrusions are disposed on one or more of the foil layers to affect the thermal gradient. In certain embodiments, one or more of the foil layers may be constructed of an insulating material to further affect the thermal gradient. The foil liner may be easily assembled, installed and replaced from within the ion source chamber.

According to one embodiment, an ion source is disclosed. The ion source comprises an ion source chamber to create a plasma; and a foil liner comprising a plurality of stacked foil layers, disposed within the ion source chamber, disposed between an interior surface of the ion source chamber and the plasma. In certain embodiments, the foil liner is "U" shaped so as to be disposed proximate sides and a bottom of the ion source chamber. In certain embodiments, the plurality of stacked foil layers each comprise tungsten foil. In certain embodiments, the foil liner comprises a first foil layer and a second foil layer, wherein the first foil layer and the second foil layer are made from different refractory metals. In certain embodiments, one of the plurality of stacked foil layers comprises protrusions to increase a spacing between adjacent foil layers. In certain embodiments, one of the plurality of stacked foil layers comprises an insulating material, which may be mica, quartz, quartz wool or other flexible insulators.

According to another embodiment, a foil liner for use within an ion source chamber is disclosed. The foil liner comprises a plurality of stacked foil layers. In certain embodiments, one of the plurality of stacked foil layers comprises a spacer layer, where the spacer layer has a surface area that is less than a surface area of another foil layer. In certain embodiments, the spacer layer may comprise gaps, a plurality of vertical strips or a plurality of horizontal strips. In certain embodiments, the spacer layer is configured to direct heat away from a center of the ion source chamber according to a desired path. In certain embodiments, one of the plurality of stacked foil layers comprises an insulating material. In certain embodiments, one of the plurality of stacked foil layers comprises protrusions to increase a spacing between adjacent foil layers.

According to another embodiment, an ion source is disclosed. The ion source comprises an ion source chamber to create a plasma; and a foil liner comprising a plurality of stacked foil layers, disposed within the ion source chamber, disposed between an interior surface of the ion source chamber and the plasma, wherein the plurality of stacked foil layers comprises an innermost layer, an outermost layer and one or more intermediate layers, and wherein the innermost layer is constructed of a refractory metal. In certain embodiments, one of the plurality of stacked foil layers is constructed of an insulating material, and the ion source further comprises a connector, wherein the connector electrically connects the innermost layer to the ion source chamber. In certain embodiments, the innermost layer comprises tungsten and one of the plurality of stacked foil layers comprises a different refractory metal.

BRIEF DESCRIPTION OF THE FIGURES

For a better understanding of the present disclosure, reference is made to the accompanying drawings, which are incorporated herein by reference and in which:

FIG. 4 is a foil liner in accordance with second embodiment;

FIG. 5 is a foil liner in accordance with a third embodiment;

DETAILED DESCRIPTION

As described above, indirectly heated cathode ion sources are often used with a liner. The liner is used to protect the underlying ion source chamber. Ions from the plasma strike the liner, causing it to decay or be damaged over time. The liner is then replaced with a new liner. During operation, the walls of the ion source chamber are protected by the liner and are not affected. These liners typically have a certain thermal conductance based on the material used to make the liner. Consequently, it is difficult to vary the temperature of the plasma without affecting the temperature of the ion source chamber. However, as stated above, in certain embodiments, it may be advantageous to maintain a temperature difference between the plasma and the ion source chamber. Specifically, ion source chamber temperature may be a critical parameter particularly for species such as carbon and boron trifluoride, where deposition of unwanted materials builds up on surfaces affecting uniformity, lifetime and cost.

Figure 1:
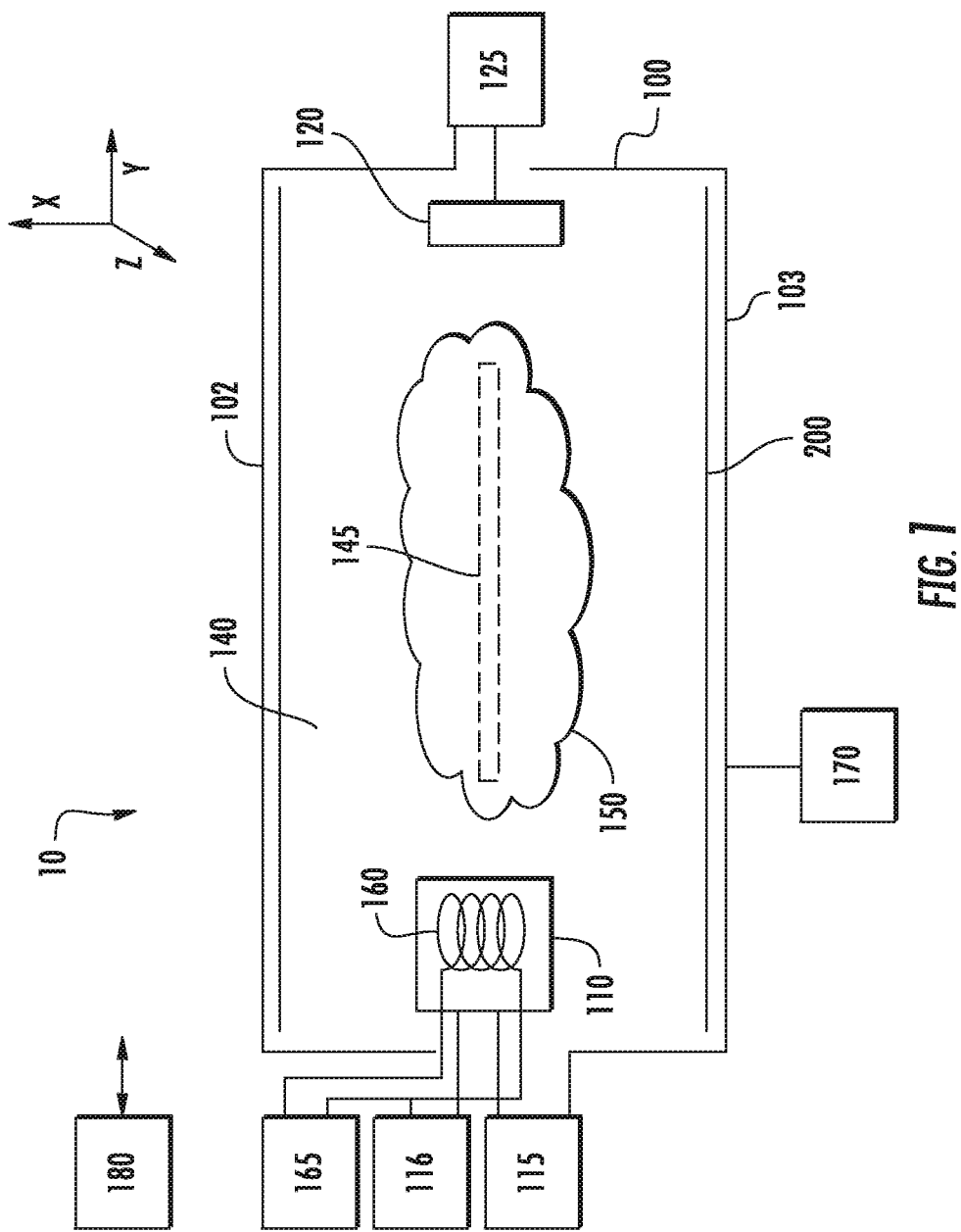
FIG. 1 is an ion source in accordance with one embodiment.

FIG. 1 shows a first embodiment of an IHC ion source 10 that overcomes these issues. The IHC ion source 10 includes an ion source chamber 100, having a bottom 101, two opposite ends, and sides 102, 103 connecting to these ends. The ion source chamber 100 may be constructed of an electrically conductive material, such as graphite, tungsten or other high temperature material. A power supply 170 may be used to bias the ion source chamber 100. In other embodiments, the ion source chamber 100 may be grounded. A foil liner 200 is disposed within the ion source chamber 100 and may cover the sides 102, 103 that connect the opposite ends of the ion source chamber 100. The foil liner 200 may also cover the bottom 101 of the ion source chamber 100. A cathode 110 is disposed inside the ion source chamber 100 at one of the two opposite ends of the ion source chamber 100. This cathode 110 is in communication with a cathode power supply 115, which serves to bias the cathode 110 with respect to the ion source chamber 100. In certain embodiments, the cathode power supply 115 may negatively bias the cathode 110 relative to the ion source chamber 100. For example, the cathode power supply 115 may have an output in the range of 0 to −150V, although other voltages may be used. In certain embodiments, the cathode 110 is biased at between 0 and −40V relative to the ion source chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 116 biases filament 160 negatively relative to the cathode 110, so these thermionic electrons are accelerated from the filament 160 toward the cathode 110 and heat the cathode 110 when they strike the back surface of cathode 110. The cathode bias power supply 116 may bias the filament 160 so that it has a voltage that is between, for example, 300V to 600V more negative than the voltage of the cathode 110. The cathode 110 then emits thermionic electrons on its front surface into ion source chamber 100.

Thus, the filament power supply 165 supplies a current to the filament 160. The cathode bias power supply 116 biases the filament 160 so that it is more negative than the cathode 110, so that electrons are attracted toward the cathode 110 from the filament 160. Finally, the cathode power supply 115 biases the cathode 110 more negatively than the ion source chamber 100.

A repeller 120 is disposed inside the ion source chamber 100 on the end of the ion source chamber 100 opposite the cathode 110. The repeller 120 may be in communication with repeller power supply 125. As the name suggests, the repeller 120 serves to repel the electrons emitted from the cathode 110 back toward the center of the ion source chamber 100. For example, the repeller 120 may be biased at a negative voltage relative to the ion source chamber 100 to repel the electrons. Like the cathode power supply 115, the repeller power supply 125 may negatively bias the repeller 120 relative to the ion source chamber 100. For example, the repeller power supply 125 may have an output in the range of 0 to −150V, although other voltages may be used. In certain embodiments, the repeller 120 is biased at between 0 and −40V relative to the ion source chamber 100.

In certain embodiments, the cathode 110 and the repeller 120 may be connected to a common power supply. Thus, in this embodiment, the cathode power supply 115 and repeller power supply 125 are the same power supply. In other embodiments, the repeller 120 may be electrically floating such that the repeller is not connected to any power supply or to ground.

Although not shown, in certain embodiments, a magnetic field is generated in the ion source chamber 100. This magnetic field is intended to confine the electrons along one direction. For example, electrons may be confined in a column that is parallel to the direction from the cathode 110 to the repeller 120 (i.e. the y direction).

Disposed on the top of the ion source chamber 100 may be a faceplate 140 including an extraction aperture 145. In FIG. 1, the extraction aperture 145 is disposed on the faceplate 140 that is parallel to the X-Y plane (parallel to the page). The faceplate 140 may be an electrically conductive material, such as tungsten. Further, while not shown, the IHC ion source 10 also comprises a gas inlet through which the gas to be ionized is introduced into the ion source chamber 100.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to maintain appropriate voltages for the filament 160, the cathode 110 and the repeller 120.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the ion source chamber 100. These electrons collide with the molecules of gas that are fed into the ion source chamber 100 through the gas inlet. These collisions create ions, which form a plasma 150. The plasma 150 may be confined and manipulated by the electrical fields created by the cathode 110, and the repeller 120. In certain embodiments, the plasma 150 is confined near the center of the ion source chamber 100, proximate the extraction aperture 145. The ions are then extracted through the extraction aperture 145 as an ion beam.

Figure 2:
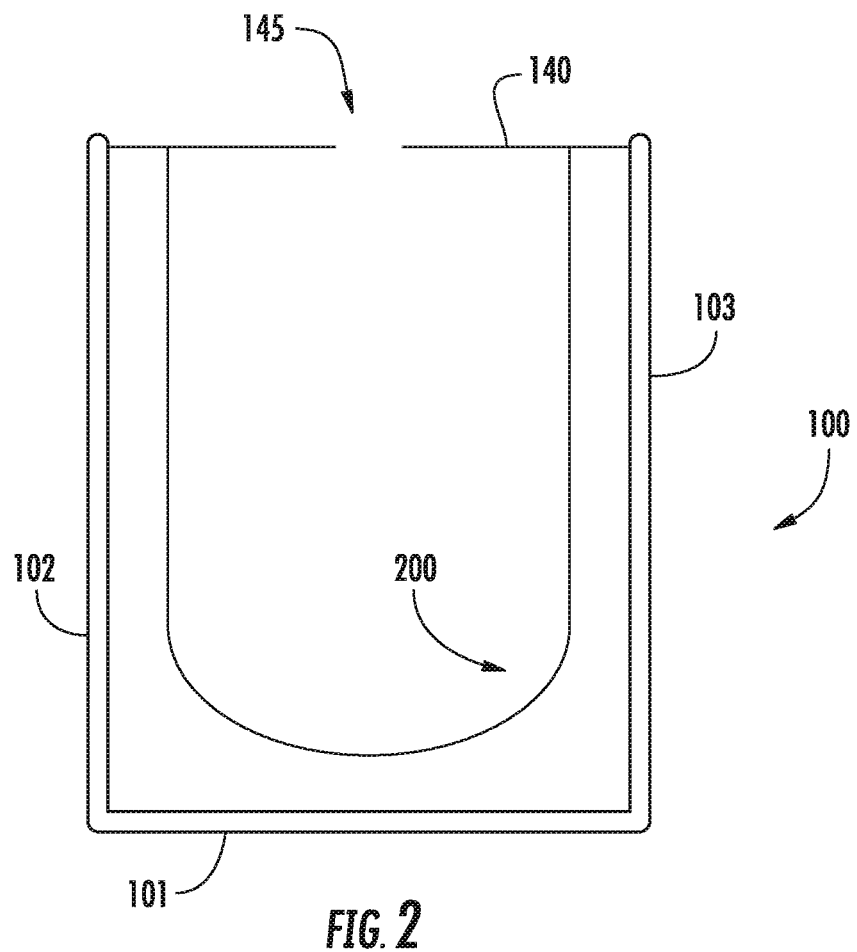
FIG. 2 is an end view of the ion source of FIG. 1 having a foil liner.

FIG. 2 shows an embodiment of a foil liner 200. In this embodiment, the foil liner 200 may be "U" shaped, such that the foil liner 200 covers the sides 102, 103 and the bottom 101 of the ion source chamber 100, or a portion of these surfaces. As seen in the figure, the rounded portion of the foil liner 200 is proximate the bottom 101 of the ion source chamber 100. The foil liner 200 may be in electrical contact with the sides 102, 103 and/or the bottom 101, and thus is maintained at the same electrical potential as the ion source chamber 100. The foil liner 200 is disposed between the plasma 150 and the ion source chamber 100. The foil liner 200 is used to shield at least a portion of the interior surfaces of the ion source chamber 100 from the plasma 150. This serves to protect the ion source chamber 100 from sputtering or other deleterious effects.

The foil liner 200 illustrated in FIG. 2 may cover two sides 102, 103 and the bottom 101, but not the two ends of the ion source chamber 100. Throughout this disclosure, the length direction refers to the direction between the ends of the ion source chamber 100, which is denoted as the Y direction in FIG. 1. The width direction refers to the direction between the sides 102, 103 of the ion source chamber, which is denoted as the X direction in FIG. 1. The thickness of the foil liner 200 refers to its dimension in the Z direction.

While the above disclosure describes a configuration where the foil liner 200 is in electrical communication with the ion source chamber 100, other embodiments are also possible. For example, the foil liner may be in communication with the faceplate 140 in certain embodiments.

The connection between the foil liner 200 and the faceplate 140 may be made in a number of ways, including interference fits, springs, or other mechanisms.

While FIG. 1 shows an indirectly heated cathode ion source, the foil liners described herein may be employed in other ion sources. For example, the foil liners may be utilized with a Bernas source, a Freeman source, a multicusp source or any type of plasma source. Thus, the present disclosure is not limited to an IHC ion source. Thus, the term "ion source" may refer to any type of device that is used to create ions.

The foil liner 200 comprises a plurality of foil layers that are disposed on top of one another. The foil layer that is in contact with the ion source chamber 100 may be referred to as the outermost layer, while the foil layer that is nearest the plasma 150 is referred to as the innermost layer. All other layers may be referred to as intermediate layers. The term "foil" and "foil layer" is used to denote a sheet of material having a thickness of less than 0.050 inches. The material used to create the "foil" or "foil layer" may be metal or a flexible insulator.

Figure 3:
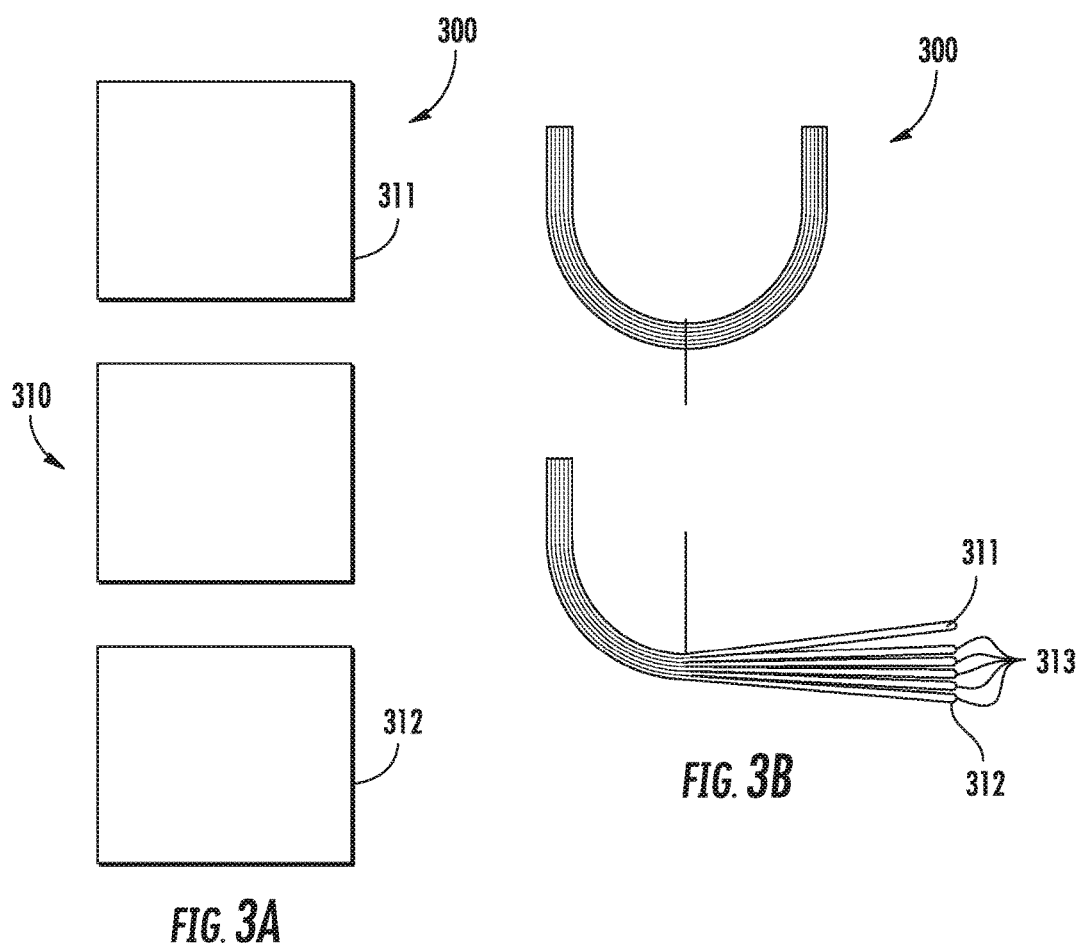
FIGS. 3A-3B illustrate a foil liner in accordance with one embodiment.

In one embodiment, shown in FIGS. 3A-3B, the foil liner 300 is formed from a plurality of foil layers 310 that are all equal in size and shape. These foil layers 310 are simply placed on top of one another to form the foil liner 300. The foil layers 310 can be any suitable material, such as tungsten, titanium or a different electrically conductive material. In certain embodiments, tungsten is used. Tungsten foil typically has a rough surface, which serves to naturally space apart the adjacent layers. The space between the foil layers 310 has an insulating effect, causing the foil layers 310 closer to the plasma 150 to be warmer than those closer to the ion source chamber 100. In certain embodiments, the foil layers 310 are between 1 and 6 inches in the length and width directions and have a thickness of between 0.002 and 0.020 inches. Of course, other dimensions are also possible and the disclosure is not limited to these dimensions. The spacing between foil layers 310 may be between about 0.001 and 0.025 inches.

These foil layers 310 are stacked atop one another to form the foil liner 300. The foil layers 310 include an innermost layer 311, an outermost layer 312 and one or more intermediate layers 313. In certain embodiments, there may not be any intermediate layers 313, such that the foil liner 300 includes two foil layers 310. The stacked set of foil layers 310, which forms the foil liner 300, is then inserted into the ion source chamber 100 so that the middle of the foil liner 300 bends in a "U" shape, as shown in FIG. 3B. Thus, the left and right edges of each foil layer 310 shown in FIG. 3A extend between the sides 102, 103 of the ion source chamber 100. In FIGS. 4-7, the foil layers are also oriented in this manner. In certain embodiments, the outer layers may be slightly larger than the inner layers, such that the ends of all foil layers 310 are aligned after the bending. In this embodiment, since all of the foil layers 310 are electrically conductive and in physical contact with one another, the innermost layer 311 is at the same potential as the ion source chamber 100, as long as the outermost layer 312 is in physical and electrical contact with the ion source chamber 100.

The thermal gradient between the innermost layer 311 and the outermost layer 312 is determined by the spacing between adjacent layers, the thermal conductivity of the material used for each foil layer 310 and the number of intermediate layers 313. For example, a large temperature gradient can be achieved using three or more intermediate layers 313 of tungsten or any high temperature refractory metal. A smaller temperature gradient would be achieved using fewer intermediate layers 313 or by pressing the foil layers together to reduce the spacing therebetween.

Further, in the embodiment of FIGS. 3A-3B, all of the foil layers 310 do not need to be the same material. For example, tungsten foil layers may be used with foil layers made from titanium or another metal. In certain embodiments, it may be preferable to have tungsten as the innermost layer 311 that is exposed to the plasma, as tungsten can be readily distinguished from the species of interest. Thus, in certain embodiments, the innermost layer 311 may be tungsten, while one or more of the intermediate layers 313 or the outermost layer 312 may be made from titanium or another high temperature refractory metal.

FIG. 4 shows another embodiment. In this embodiment, the foil liner 400 comprises a plurality of foil layers 410. Like the embodiment of FIGS. 3A-3B, the foil layers 410 include an innermost layer 411, an outermost layer 412 and one or more intermediate layers 413. In certain embodiments, there may not be any intermediate layers 413, such that the foil liner 400 includes exactly two foil layers 410. At least one of the foil layers 410 has a plurality of protrusions 420. In certain embodiments, the outermost layer 412 may have protrusions 420. In certain embodiments, as shown in FIG. 4, one or more of the intermediate layers 413 may have protrusions 420. However, protrusions may also be disposed on the innermost layer 411 and the outermost layer 412. These protrusions 420 may be stamped, punched or otherwise introduced into the foil layer 410. These protrusions 420 may be any suitable height, such as between twice the height of the foil layer 410 to 0.02 inches, although other heights are possible. These protrusions 420 may be between 0.125 and 1.0 inches in the length and width directions, in certain embodiments. The protrusions 420 may be spaced apart from each other by between 0.125 and 1.0 inches in the length and width directions.

The protrusions 420 tend to insure a minimum separation or spacing between adjacent foil layers 410. Thus, the foil layers 410 may be spaced further apart when the foil layers 410 include protrusions 420. Further, the protrusions 420 also serve to limit the amount of thermal and electrical contact between adjacent foil layers 410. Protrusions 420 may be utilized with metal foils that tend to be very smooth so as to introduce a minimum spacing between the foil layers 410. As with the embodiment of FIGS. 3A-3B, the foil layers 410 do not need to be the same material. Tungsten, titanium, other metal foils or any combination thereof may be employed. Also, as shown in FIG. 3B, the foil liner 400 may also be bent so as to form a "U" shape.

FIG. 5 shows another embodiment of a foil liner 500. In this embodiment, one or more of the foil layers 510 may be a spacer layer 520. A spacer layer 520 is defined as a layer in which one or more gaps 530 are introduced into that layer. Like the embodiment of FIGS. 3A-3B, the foil layers 510 include an innermost layer 511, an outermost layer 512 and one or more intermediate layers 513. In certain embodiments, the spacer layer 520 may be any intermediate layer 513 disposed between the innermost layer 511 and the outermost layer 512. In this way, the physical connections between the spacer layer 520 and its adjacent foil layers 510 is reduced, decreasing the heat transfer between the innermost layer and the outermost layer. In other words, heat is not conducted between adjacent foil layers 510 in regions where gaps 530 are disposed in the spacer layer 520.

The use of spacer layers 520 may also help direct or centralize the heating of the ion source chamber 100. FIG. 5 shows an intermediate layer 513 that is formed with two gaps 530. In this embodiment, there will be a large space between the foil layers 510 on either side of the spacer layer 520 in the region of the gaps 530. In this way, the thermal conduction from the innermost layer 511 to the outermost layer 512 is reduced, especially in the vicinity of the gaps 530. Consequently, more heat will be conducted in those regions where the gaps 530 are not disposed. Thus, regions of the interior of the ion source chamber 100 proximate the gaps 530 may be warmer than the regions where the gaps 530 are not disposed. Using the spacer layer 520 shown in FIG. 5, the ends of the ion source chamber 100 may be cooler than the center of the ion source chamber 100, since the gaps 530 are disposed near the center, while the spacer layer 520 has material along its edges.

While FIG. 5 shows a spacer layer 520 having two gaps 530 separated by a horizontal member 531, other embodiments are also possible. For example, the spacer layer 520 may have more or less than two gaps 530. Further, the gaps 530 may be separated by vertical members or horizontal members, or a combination. Further, the gaps 530 need not be rectangular. The gaps 530 may be circular, oval, or any other shape.

Thus, in FIG. 5, the spacer layer 520 is a single foil having one or more gaps 530. However, other embodiments are also possible.

Figure 6:
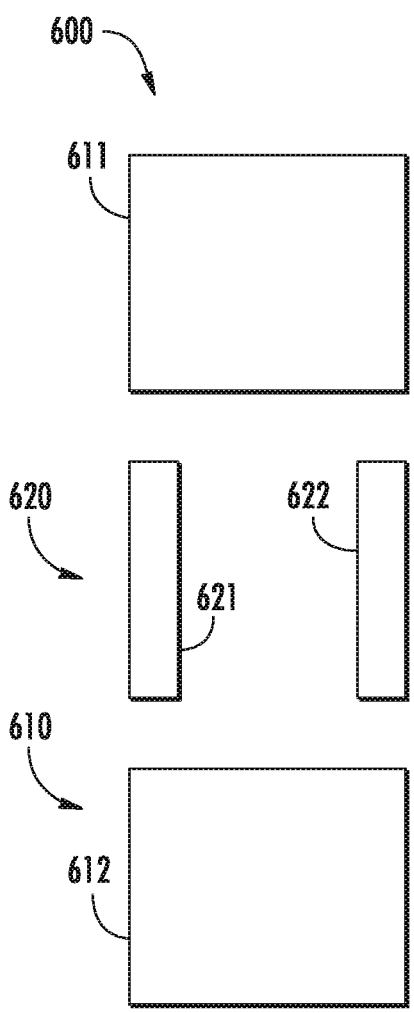
FIG. 6 is a foil liner in accordance with a fourth embodiment.

FIG. 6 shows another embodiment of a foil liner 600. The foil liner 600 comprises a plurality of foil layers 610, including an innermost layer 611, an outermost layer 612 and a spacer layer 620. Additionally, intermediate layers may also be included in the foil liner 600. In this embodiment, the spacer layer 620 comprises a plurality of vertical strips 621, 622. The vertical strips 621, 622 may each be the same length as the other foil layers 610. When bent into a U shape, the vertical strips 621, 622 are oriented with the longer dimension extending between the two ends of the ion source chamber 100. This configuration may further reduce the transfer of heat between the innermost layer 611 and the outermost layer 612. As explained above, the configuration of the vertical strips 621, 622 may help direct heat in a desired path, thus affecting the temperatures within the interior of the ion source chamber 100.

Figure 7:
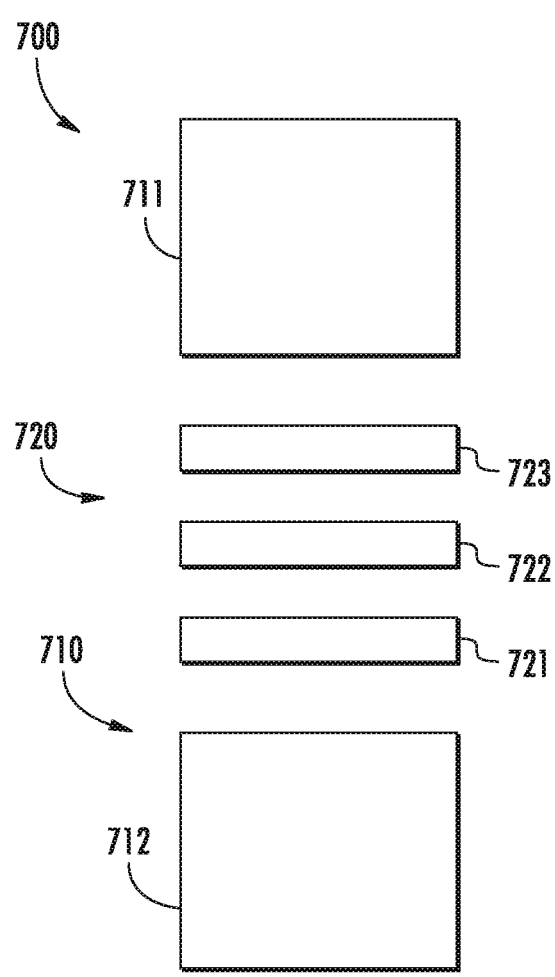
FIG. 7 is a foil liner in accordance with a fifth embodiment.

FIG. 7 shows another embodiment of a foil liner 700. The foil liner 700 comprises a plurality of foil layers 710, including an innermost layer 711, an outermost layer 712 and a spacer layer 720. Additionally, intermediate layers may also be included in the foil liner 700. In this embodiment, the spacer layer 720 comprises a plurality of horizontal strips 721, 722, 723. The horizontal strips 721, 722, 723 may each be the same width as the other foil layers 710. When bent into a U shape, the horizontal strips 721, 722, 723 are oriented with the longer dimension extending between the two sides 102, 103 of the ion source chamber 100. This configuration may further reduce the transfer of heat between the innermost layer 711 and the outermost layer 712. As explained above, the configuration of the horizontal strips 721, 722, 723 may help direct heat in a desired path, thus affecting the temperatures within the interior of the ion source chamber 100.

In each of these embodiments, the spacer layer is a layer that has less surface area than the innermost layer. For example, the innermost layer may be a rectangular shape having a certain dimensions that results in a certain surface area. In each of the embodiments described herein, the spacer layer, whether constructed as a unitary sheet or a plurality of smaller sheets, occupies less surface area, resulting in gaps in that layer. It is these gaps that serve to increase the thermal gradient between the innermost layer and the outermost layer. Further, the structure and configuration of the spacer layer may also serve to direct and centralize the heat to specific regions of the ion source chamber 100. For example, if the gap is disposed near the center of the spacer layer, such as is shown in FIG. 6, the heat transfer will be reduced in this area. Thus, the temperature at the center of the ion source chamber 100 may increase relative to the ends of the ion source chamber 100 due to the placement of the gap in the spacer layer. Thus, the configuration of the spacer layer may direct the heat away from the center of the ion source chamber according to a predetermined path.

The above disclosure describes various ways to create a temperature gradient between the innermost foil and the outermost layer so that the plasma is maintained at a higher temperature than the ion source chamber 100. However, in other embodiments, the foil layers may be tightly pressed together to maximize the heat transfer between the various foil layers.

In certain embodiments, one or more foil layers may not be electrically conductive. For example, the innermost layer may be electrically conductive, however any of the other foil layers need not be electrically conductive. In certain embodiments, an insulating material, such as mica, quartz, quartz wool or any other flexible insulator may be used to form one of the foil layers.

Figure 8:
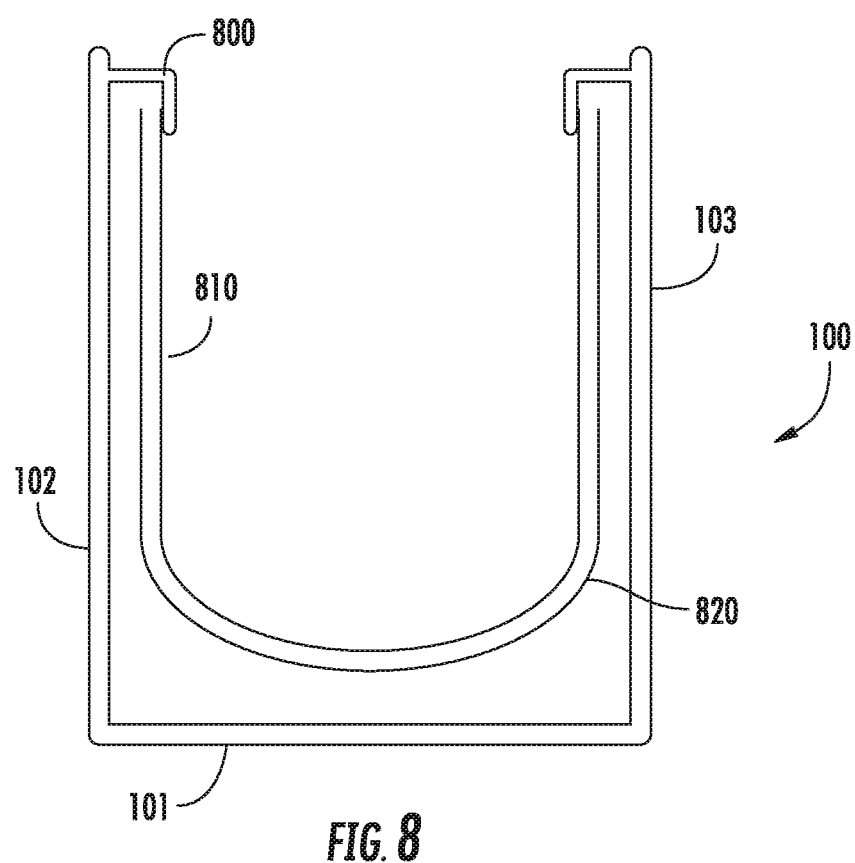
FIG. 8 shows a mechanism to electrically connect the innermost layer to the ion source chamber.

In these embodiments, the innermost foil layer may not be electrically connected to the ion source chamber 100 because of the intervening insulating layer. In these embodiments, a clip or other connector may be used to electrically connect the innermost layer to the ion source chamber. FIG. 8 shows one such embodiment. In this figure, the insulating layer 820 is disposed between the innermost layer 810 and the ion source chamber 100. Consequently, a connector 800 to employed to electrically connect the innermost layer 810 to the ion source chamber 100. The connector 800 may be any electrically conductive material and may attach the ion source chamber 100 in any suitable manner. In certain embodiments, the innermost layer 810 is disposed behind the connector 800, such that spring force keeps the innermost layer 810 in place and electrically connected to the connector 800. In certain embodiments, the area of where the innermost layer 810 and the connector 800 contact one another is minimized so that a thermal gradient can exist between the innermost layer 810 and the ion source chamber 100. In other embodiments, the innermost layer 810 may be electrically connected to the faceplate. The use of an insulating layer may further serve to increase the temperature gradient between the innermost layer 810 and the ion source chamber 100.

To assemble this foil liner, the foil liner is bent into a "U" shape and inserted into the ion source chamber 100. The natural inclination of the foil sheets to straighten will cause the innermost layer 810 to contact the connector 800 without any need to fasten the foil liner in place.

The foil liner according to any of these embodiments may be packaged in a number of different ways. In one embodiment, a stack of foil layers are packaged together. In this embodiment, the operator simply bends the stack into a "U" shape and installs the foil liner in the ion source chamber. In another embodiment, the foil layers are packaged separately and the operator assembles the stack of foil layers according to the desired operating conditions. The stack, once assembled, is then bent into a "U" shape and installed in the ion source chamber.

In certain embodiments, the foil layers may be tack welded or employ other means of securing them at a limited number of points, thus allowing for movement between the layers.

The embodiments described above in the present application may have many advantages. First, the foil liner is easy to install and replace, simplifying the preventative maintenance procedure. Secondly, the selection of different foil layers, with different materials and/or different attributes, such as gaps or protrusions, allows a foil liner to be assembled to achieve any desired operating condition within the ion source chamber. Additionally, the use of a foil liner may reduce cost, as these liners are replaceable components. Further, the selection of particular materials for the liners may increase the output of a particular implant species or could eliminate a compound from forming due to gas and solid combinations.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
   an ion source chamber, wherein a plasma is created in the ion source chamber; and
   a foil liner comprising a plurality of stacked foil layers, disposed within the ion source chamber, disposed between an interior surface of the ion source chamber and the plasma.

2. The ion source of claim 1, wherein the foil liner is "U" shaped so as to be disposed proximate sides and a bottom of the ion source chamber.

3. The ion source of claim 1, wherein the plurality of stacked foil layers each comprise tungsten foil.

4. The ion source of claim 1, wherein the foil liner comprises a first foil layer and a second foil layer, wherein the first foil layer and the second foil layer are made from different refractory metals.

5. The ion source of claim 1, wherein one of the plurality of stacked foil layers comprises protrusions to increase a spacing between adjacent foil layers.

6. The ion source of claim 1, wherein one of the plurality of stacked foil layers comprises an insulating material.

7. The ion source of claim 6, wherein the insulating material comprises mica, quartz or quartz wool.

8. A foil liner for use within an ion source chamber, comprising a plurality of stacked foil layers, wherein one of the plurality of stacked foil layers comprises a spacer layer.

9. The foil liner of claim 8, wherein the spacer layer has a surface area that is less than a surface area of another foil layer.

10. The foil liner of claim 9, wherein the spacer layer comprises one or more gaps.

11. The foil liner of claim 9, wherein the spacer layer comprises a plurality of vertical strips.

12. The foil liner of claim 9, wherein the spacer layer comprises a plurality of horizontal strips.

13. The foil liner of claim 9, wherein the spacer layer is configured to direct heat away from a center of the ion source chamber according to a desired path.

14. A foil liner for use within an ion source chamber, comprising a plurality of stacked foil layers, wherein one of the plurality of stacked foil layers comprises an insulating material.

15. A foil liner for use within an ion source chamber, comprising a plurality of stacked foil layers, wherein one of the plurality of stacked foil layers comprises protrusions to increase a spacing between adjacent foil layers.

16. An ion source, comprising:
   an ion source chamber, wherein a plasma is created in the ion source chamber; and
   a foil liner comprising a plurality of stacked foil layers, disposed within the ion source chamber, disposed between an interior surface of the ion source chamber and the plasma, wherein the plurality of stacked foil layers comprises an innermost layer, an outermost layer and one or more intermediate layers, and wherein the innermost layer is constructed of a refractory metal.

17. The ion source of claim 16, wherein one of the plurality of stacked foil layers is constructed of an insulating material, and further comprising a connector, wherein the connector electrically connects the innermost layer to the ion source chamber.

18. The ion source of claim 16, wherein the innermost layer comprises tungsten and one of the plurality of stacked foil layers comprises a different refractory metal.

19. A foil liner for use within an ion source chamber, comprising a plurality of stacked foil layers, wherein the foil liner comprises at least a first foil layer and a second foil layer, wherein the first foil layer and the second foil layer are made from different refractory metals.

* * * * *